United States Patent [19]

Reece et al.

[11] Patent Number: 4,510,572
[45] Date of Patent: Apr. 9, 1985

[54] SIGNATURE ANALYSIS SYSTEM FOR TESTING DIGITAL CIRCUITS

[75] Inventors: John M. Reece, King County; Robert G. Martin, Snohomish County; John R. Franzel, King County, all of Wash.

[73] Assignee: Data I/O Corporation, Redmond, Wash.

[21] Appl. No.: 334,880

[22] Filed: Dec. 28, 1981

[51] Int. Cl.³ .................... G06F 11/00; G01R 31/28
[52] U.S. Cl. ................................. 364/489; 371/25; 324/73 AT; 324/73 R
[58] Field of Search ................ 364/481, 489, 579; 371/25; 324/73 R, 73 AT

[56] References Cited

U.S. PATENT DOCUMENTS

| | | | |
|---|---|---|---|
| 3,976,864 | 8/1976 | Gordon et al. | 371/26 |
| 4,194,113 | 3/1980 | Fulks et al. | 371/25 X |
| 4,348,760 | 9/1982 | Rice et al. | 371/25 X |

OTHER PUBLICATIONS

Transition Count Testing of Combinational Logic Circuits, J. P. Hayes, IEEE Transactions on Computers, Vo. C.25, No. 6, Jun. 1976, pp. 613–620.
Testing a Microprocessor Product Using Signature Analysis, H. J. Nadig, Conference 1978 Semiconductor Test Conference, Cherry Hill, N.J., Oct.-Nov. 1978, pp. 159–169.
Logic-State and Signature Analysis Combine for Fast, Easy Testing, I. H. Spector, Electronics/Jun. 8, 1978, vol. 51, No. 12, pp. 141–145.
Retrofitting for Signature Analysis Simplified, R. Rhodes-Burke, Hewlett-Packard Journal, Jan. 1982, vol. 33, No. 1, pp. 9–16.

Primary Examiner—Edward J. Wise
Attorney, Agent, or Firm—Seed and Berry

[57] ABSTRACT

A signature analyzer for testing digital circuits. The analyzer includes a memory which is initially programmed with a set of signatures characterizing the digital signals on the nodes of a correctly operating circuit. The nodes of a test circuit are then sequentially applied to a signature generator formed by a multi-stage shift register having the outputs of selected stages fed back to a gate to which the digital signal is applied. The signature generated by the shift register is compared to each of the signatures stored in memory until a signature match is found, thus indicating that the digital circuit, at least as far as the test node is concerned, is operating correctly. The signature generated by the shift register consists of twenty-four bits to provide a probability of error which is comparable to the probability of error in comparing a sixteen-bit signature with the signature from a specifically identified node. At the conclusion of a gate period, sixteen bits of the signature are displayed as four hexedecimal digits. In order to minimize the probability of error, the analyzer also counts the number of transitions of the digital signal during the gate period and compares the count to transition counts stored in memory for the digital signals on the nodes of a correctly operating circuit. A comparison is then made of the transition count at the test node with each of the transition counts stored in memory. The analyzer thus ensures a transition count match as well as a signature match.

17 Claims, 14 Drawing Figures

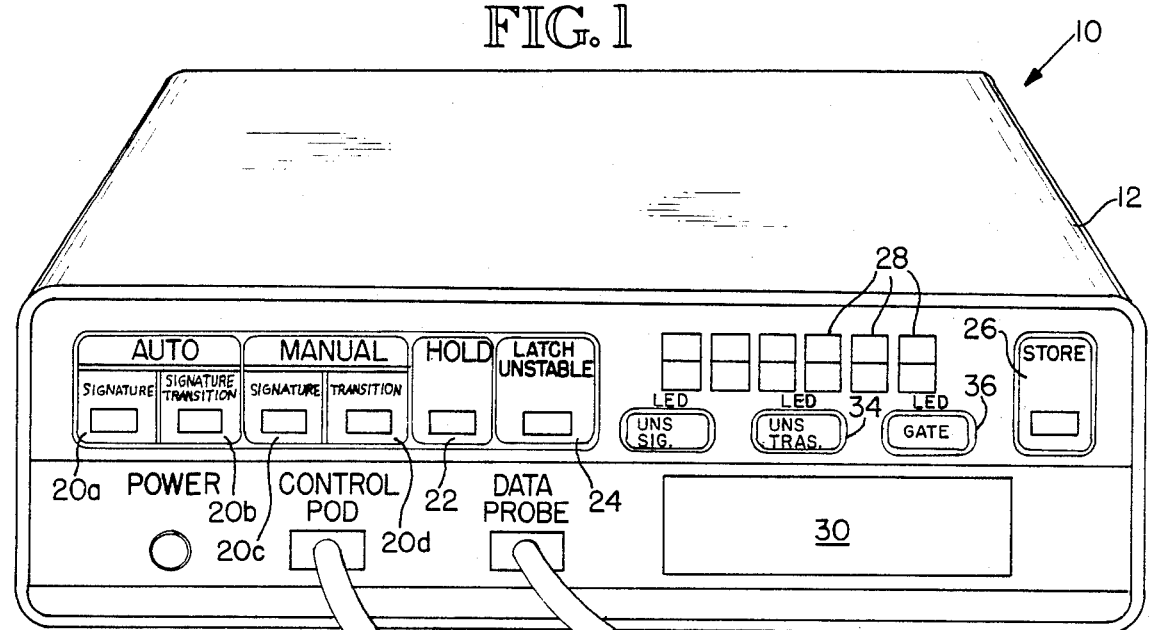
FIG. 1
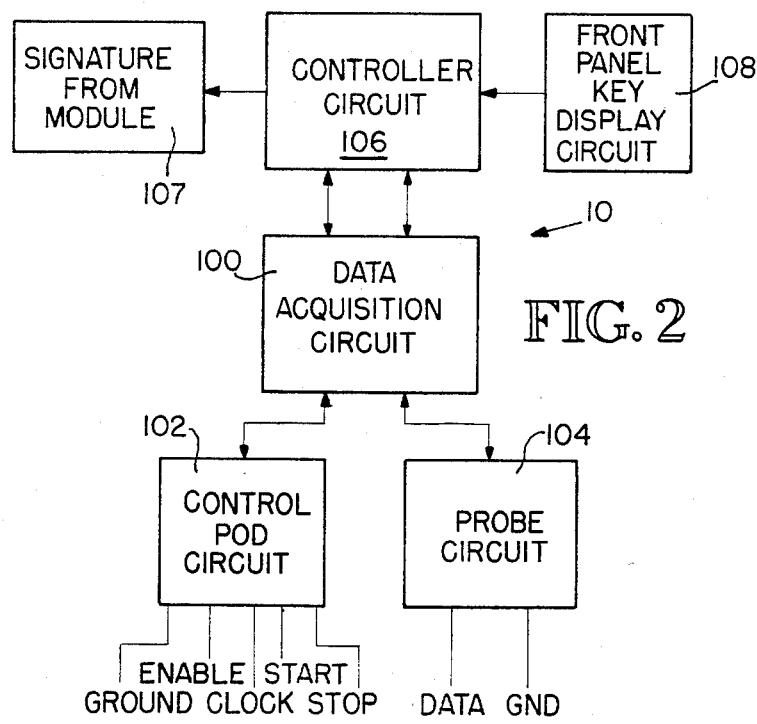
FIG. 2
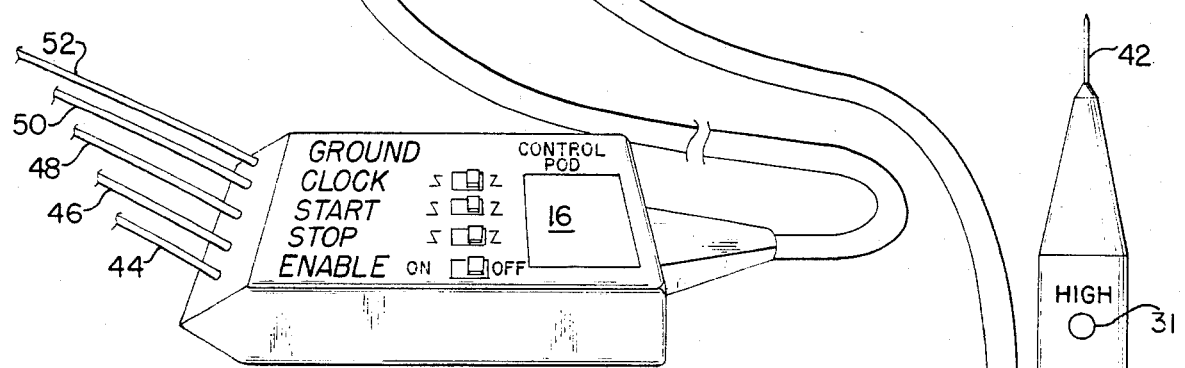
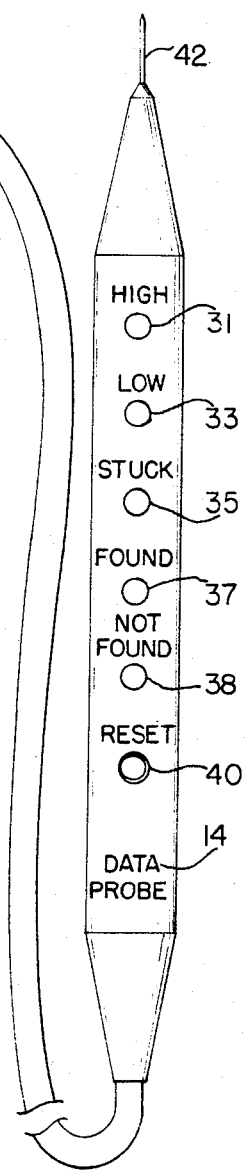

OVERALL FLOW CHART

SIGNATURE ANALYSIS SYSTEM FOR TESTING DIGITAL CIRCUITS

TECHNICAL FIELD

This invention relates to electronic test equipment, and more particularly, to a system for testing the operation of a digital circuit by deriving a signature indicative of a digital signal at a test node during a large number of clock periods.

BACKGROUND ART

A number of different approaches have been developed to test for the correct operation of digital circuits. The most basic device is a logic probe which is placed in contact with each node under test. The probe includes an indicating lamp which flashes upon the transitions of a signal at the node under test, thereby indicating that a digital signal is present on the node. However, the logic probe provides no indication that the digital signal at the node is correct, i.e., the digital signal that should be present on the node if the circuit is operating correctly.

Attempts have also been made to use conventional oscilloscopes to test digital circuits. Although such techniques are satisfactory for extremely simple digital circuits, more complex digital circuits cannot be adequately tested with an oscilloscope for two basic reasons. First, the signals generated by complex digital circuits are, in themselves, extremely complex. It is thus difficult to determine what the correct signal should be, and even more difficult to compare the actual signal to the correct signal. Second, verification that the digital signal is correct requires that the signal be compared with other signals in the circuit during specific time periods. Yet it is extremely difficult to synchronize the oscilloscope to these signals in order to make such comparisons.

The limitations of oscilloscopes for digital circuit testing has spawned the development of the logic analyzer, which is basically a storage oscilloscope allowing sequentially stored signals to be compared with each other. Although such logic analyzers solve some of the problems inherent in digital circuit testing using oscilloscopes, they nevertheless are incapable of easily and quickly verifying the correct operation of digital circuits or isolating faults. Also, like oscilloscopes, they can be effectively used only by skilled testing personnel.

Although the above-described techniques are only somewhat inadequate for moderately complex digital circuits, they are hopelessly inadequate for microprocessor-based systems utilizing bus architecture. This is because it is not possible to test the outputs of specific individual hardware logic elements which are adapted to respond to a specific input in a well-defined manner. Instead, the microprocessor and the large-scale integration components with which it is connected generate complex data streams on the buses. Since a large number of devices are connected to common buses, it is not even possible to be sure of what device is generating a signal on the bus. Although short diagnostic programs can be written for microprocessor-based systems in order to trigger an oscilloscope at an appropriate point, this approach assumes that the microprocessor and associated hardware are functioning well enough to execute such programs.

Another problem associated with testing digital circuits by the above-described techniques is the requirement that the testing personnel be extremely knowledgeable, both as to the circuit under test and their training in electrical engineering. The high cost of such personnel greatly increases the expense of testing and repairing digital circuits.

As a result of the seemingly insurmountable difficulties encountered in testing microprocessor devices with conventional techniques, manufacturers of microprocessor-based devices have generally relied on board exchange servicing programs. That is, when a microprocessor device becomes inoperative, the circuit boards are exchanged for boards known to be functional until the system is once again operable. This servicing technique is satisfactory in many instances, but it is entirely unacceptable in many other instances. For example, board exchange programs inherently result in a considerable delay in making the needed repair, often resulting in unacceptable downtime. Also, some types of digital equipment are not sufficiently portable to readily allow portions of the equipment to be exchanged. Furthermore, a board exchange program results in a high board inventory and administrative expense, and some boards will function properly at a test facility but not in the field equipment.

As a result of these aforementioned problems, techniques have been developed to allow relatively unskilled personnel to quickly verify the correct operation of a digital circuit of even the most complex variety, such as microprocessor-based systems using bus architecture. Both of these techniques rely upon data compression principles in which data indicative of the parameters of a relatively complex signal occurring on a test node during a test period are reduced to a single number.

The first data compression testing technique is known as "transition counting," in which the number of changes of logic level on a test node are counted during the test period. The number of transitions is then compared to a previously recorded number indicative of the number of transitions which should occur during that period for a properly operating circuit. Transition counting is certainly more desirable than logic probe testing since it verifies not only that transitions are occurring but also that the number of such transitions is correct. Transition count testing is also more advantageous than oscilloscope or logic analyzer testing since the testing can be done by relatively unskilled personnel. Although transition counting is superior to conventional testing techniques, it nevertheless suffers from a lack of reliability since there is no guarantee that the transitions are occurring at the proper times.

An improved data compression testing technique described in U.S. Pat. No. 3,976,864 has been developed to provide a more reliable verification of correct operation than is possible with transition counting. This later technique, termed "signature analysis," derives a data word indicative of a digital signal during a test period of many clock cycles. The signature is generated by a multi-bit shift register that records the output of an exclusive OR-gate. The exclusive OR-gate has as its inputs the digital signal from the node under test and the outputs of specified stages of the shift register. The data word stored in the shift register at the conclusion of the test period is thus an indication of the test signal during each of the clock cycles in the test period. For a sixteen-bit shift register, there are $2^{16}$ (or 65,536) possible data words during any sample period. These sixteen bits may then be encoded in groups of four and applied to an indicator to generate a four-digit hexadecimal signature. The signature thus characterizes the digital signal on a particular circuit node during a predetermined sample period. Moreover, since the clock signal for the signature analyzer is derived from the circuit under test, the signature analyzer operates in synchronism with the circuit. As a result, the signature indicates the presence of transition time errors. The large number of possible signatures for a digital signal occurring over a substantial gate period results in a high probability of producing a unique signature for each node. Thus, recording the signatures of each node on a circuit which is known to be operating correctly fully characterizes a properly operating circuit. The nodes for a circuit under test can then be sampled to produce respective signatures which are compared to the signatures for the corresponding nodes of the original circuit.

Although signature analysis testing allows quick and accurate testing of even the most complex digital circuits and microprocessor-based equipment, its efficiency of use is nevertheless limited by the necessity of identifying a particular node and then manually comparing the signature obtained for that node with a reference source which lists each node. The manual comparison is generally accomplished through a variety of techniques. One technique involves a comparison of each signature and its corresponding node with a table of signatures and nodes. Alternatively, a schematic or circuit board layout annotated with signatures may be used. However, service personnel must still locate the proper test node from the pin numbers on the schematic or board layout and refer to both the signature analyzer and the schematic or board layout to manually compare the measured signature to the correct signature. This manual comparison, while substantially easier than comparing digital wave forms to each other with an oscilloscope, nevertheless involves the possibility of some error. This is particularly true where a large number of positive comparisons have been found, prompting the service personnel to expect the subsequent comparisons to be positive. Under such circumstances, service personnel can perceive the comparison as being positive even when it's not.

In an attempt to reduce the time required for manual comparisons, templates have been developed in which apertures are formed at positions corresponding to the positions of the nodes on the circuit board under test. The apertures allow access to each of the nodes, and respective signatures printed on the template adjacent the apertures allow quick and relatively error-free comparison between the actual signature for a node and the correct signature for that node. However, even this technique is free of error, the need for special templates for each circuit is undesirable, particularly where the correct signatures for a circuit are easily or frequently changed, as is the case with microprocessor devices.

DISCLOSURE OF THE INVENTION

It is an object of the invention to allow signature analysis testing of a digital circuit without the need to match a signature from a specific test node with a reference signature corresponding to that node.

It is another object of the invention to provide a signature analysis system which requires no manual signature comparisons.

It is still another object of the invention to provide a signature analysis system which is capable of automatically storing reference signatures from a correctly operating circuit to facilitate quick and accurate signature documentation of the circuit.

It is a further object of the invention to provide a signature analysis system which combines signature analysis and transition counting to minimize the probability of error of such system.

These and other objects of the invention are provided by a signature analysis system which compares a signature from a test node of the digital circuit with a recorded set of signatures corresponding to the digital signals on the nodes of the circuit while operating correctly. The basis of the invention is the previously unrecognized principle that a signature indicative of an incorrect digital signal at a test node is unlikely to be identical to the correct signature from any other node of that circuit. This is markedly different from the principle of conventional signature analysis systems that rely upon the assumption that a signature indicative of an incorrect digital signal at a specific test node is unlikely to be identical to the correct signature at that same node. The assumption on which the inventive signature analysis system is based is valid if: (1) the method by which the signature is generated is not similar to the method of operation of the test circuit; (2) the number of bits in the signature word is great enough to yield an acceptably low probability of two different data streams producing the same signature value; (3) the method of failure of the test point does not make the data pattern identical to any other point in the circuit; and (4) the number of bits in the signature word is sufficient to yield an acceptably low probability of an incorrect signature value being the same as one of the correct values elsewhere in the circuit.

The ability to compare a signature from a test node with a table of recorded signatures without regard to the identity of the test node eliminates the need for identifying specific test nodes. The system preferably generates the signature by a multi-stage shift register having an input connected to the output of a logic gate. The logic gate has a plurality of inputs which receive the digital signal from the test node and respective outputs of selected stages of the shift register. A control means allows the shift register to respond to the digital signal during a gate period which is synchronized to the operation of the digital circuit. The system includes a signature memory for storing a set of signatures indicative of the digital signals on the nodes of the circuit when it is operating correctly during the gate period. The system automatically compares each signature indicative of a test node with all of the recorded signatures in the memory and provides an indication responsive to finding the identical signature, thereby indicating that digital signal on the test node corresponds to that of a correctly operating circuit. Conversely, in the event that the comparator is unable to match the test signature to one of the signatures recorded in memory, the system provides an indication that the digital signal at the test node is incorrect. The system further includes means for programming the memory with signatures from a correctly operating digital circuit in order to facilitate quick and accurate signature documentation of a circuit. This is particularly important when one considers that even minor changes in a circuit or software program can completely modify the signature characteristics of the circuit. In order to prevent a signature from one node being recorded twice while ensuring that the signatures from all nodes are recorded, the system counts the number of signatures recorded in the memory and provides an indication in the event that an attempt is made to record duplicate signatures. The gate period is initiated by a START signal from the circuit under test and is terminated by a STOP signal from the circuit. In order to eliminate certain portions of the digital signal from contributing to the signature, an ENABLE signal from the digital circuit may be used to disable the signature generator during a portion of the gate period. The system also compares signatures from the test node from one gate period to the next in order to detect an unstable signature condition. In the event that an unstable signature occurs, the system can record the unstable signature and continuously display it in order to facilitate detection of intermittent defects in the circuit. The probability of error in the system is reduced by also counting the number of transitions of the digital signal during the gate period and providing an indication of the correct digital signal only if there is a signature match and a transition count match.

BRIEF DESCRIPTION OF THE DRAWINGS

FIG. 1 is an isometric view of the signature analysis system for testing digital circuits.

FIG. 2 is a block diagram of the signature analysis system for testing digital circuits.

BEST MODE FOR CARRYING OUT THE INVENTION

Figures 3, 4:
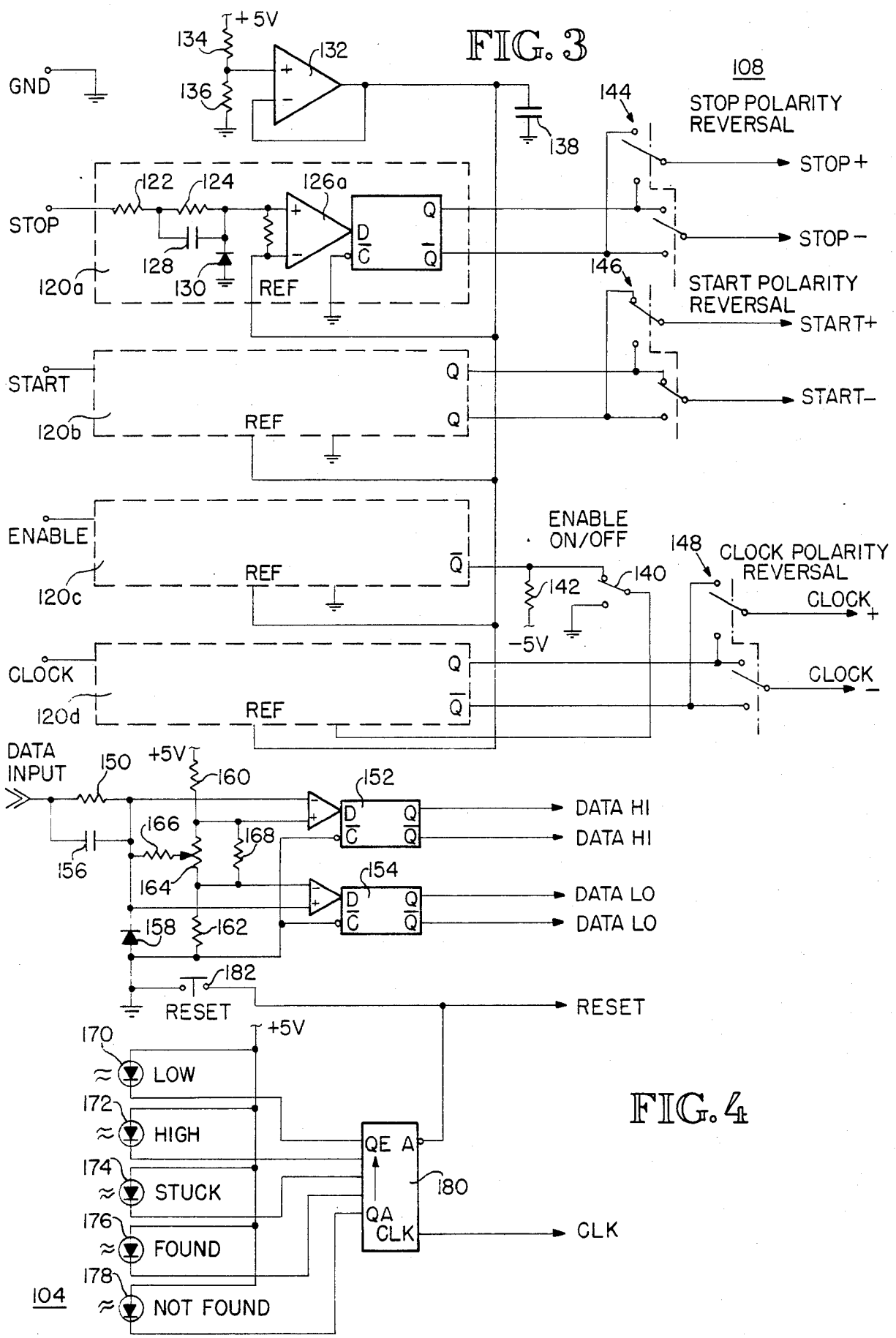
FIG. 3 is a schematic of a control pod which receives signals identifying the sample period and clock cycles of the circuit under test.
FIG. 4 is a schematic of the data probe for connecting the signature analysis system to the circuit under test.

The signature analysis system 10, as illustrated in FIG. 1, includes a housing 12 containing most of the system electronics, the remainder of which is found in a DATA probe 14 and a control pod 16.

The front of the housing 12 is covered by a panel 18 having four "mode" switches 20 for controlling the operating mode of the system, a "hold" switch 22 for causing a signature to remain on the display until a manual reset switch is pressed, a "latch unstable" switch 24 which causes the display of a signature that varies from one gate period to the next, a "store" switch 26 for storing signatures from a circuit known to be operating correctly, and a digital display 28. The operation of these switches is explained in detail hereinafter.

The probe 14 contains a number of indicator lamps 31–38 and a reset switch 40 as well as a conductive tip 42 for making contact with test nodes of a circuit.

The control pod 16 contains five leads 44–52 which are connected to the circuit under test. Line 52 is connected to the system ground of the circuit, and CLOCK line 50 is connected to the clock of the circuit. START line 48 is connected to a node of the circuit under test which changes state at a known point in time and may thus serve as the start of the gate period. Similarly, STOP line 46 is connected to a circuit node which changes state at a predetermined point in time after the START line transition and is thus capable of identifying the end of the gate period. The ENABLE line 44 is connected to a circuit node which changes state during a predetermined period in the gate period when it is desired that the digital signal on the test node not contribute to the signature. The signal on the ENABLE line 44 thus disables the system during this predetermined period so that the signature is indicative of the digital signal from the START transition on line 48 to the beginning of the predetermined period and from the end of the predetermined period to the transition of the signal on STOP line 46.

In the manual mode, the system 10 is capable of generating either a signature or a transition count for each node. Accordingly, actuating switch 20c places the system 10 in the manual signature mode. In this mode, the reset switch 40 on the probe is pressed and the contact 42 is placed in contact with the test node. During the next gate period, the system 10 generates a four-digit hexadecimal signature corresponding to the digital signal on the test node during the gate period and displays the signature on the display 28. The signature is then compared to the correct signature for that node. The system 10, operating in the manual mode, is thus quite similar to conventional signature analysis systems.

In the manual transition count mode, switch 20d is actuated and the system 10 provides a visual indication on display 28 of the number of transitions occurring on the test node during the sample period.

The primary disadvantage of the manual mode is the amount of time required to compare the signature on the display 28 with the correct signature for that node. In the automatic signature mode, selected by actuating switch 20a, manual signature comparison is not required. As mentioned above, the signatures for each node in the circuit under test are stored in a programmable read-only memory. The system, when operating in the auto-signature mode, merely determines if the signature corresponding to the digital signal on the test node is the same as any signature stored in the programmable read-only memory. The programmable read-only memory is mounted on a board which is plugged into a connector 30 on the front panel of the system 10. The programmable read-only memory may be programmed with signatures using a conventional PROM programmer or it may be programmed by the system 10. In this later case, the system 10 is placed in the manual signature mode by actuating switch 20c. The probe 14 is placed in contact with a node in the the circuit under test, and a signature is computed and displayed. The store switch 26 is then activated by pressing it once. The next blank location in the read-only memory is displayed. Upon pressing the store switch 26 a second time, the signature for that node is stored in the programmable read-only memory. In order to prevent duplicate signatures from being stored, the system 10 determines if a detected signature was previously stored and generates an appropriate alarm in response thereto. In order to ensure that the signatures from all nodes are recorded, the system counts the number of signatures that have been recorded and displays the next blank location in the read-only memory on the on display 28.

As explained in greater detail hereinafter, the correctness of a detected signature is vertified by recording the signature during each of several clock periods and comparing the signatures to ensure that they are identical. Similarly, the correctness of a transition count is verified by comparing transition counts over several gate periods. In the event of an unstable signature (i.e., in which the signature varies from gate period to gate period), indicating light 32 is illuminated to indicate the presence of an unstable signature. Similarly, light 34 is illuminated to indicate an unstable transition count in which the transition count varies from gate period to gate period. A final indicating lamp 36 is illuminated during each gate period.

An important feature of the signature analysis system 10 is the ability to leave the system 10 connected to a circuit node over a substantial period of time and detect any malfunction of the circuit causing an unstable signature. This feature is selected by actuating LATCH UNSTABLE switch 24, thereby causing the system 10 to continuously display the first unstable signature that occurs.

The HOLD switch 22 may be actuated to cause the system 10 to capture and display the first signature computed after the reset button 40 on the probe 14 is actuated. Otherwise, the system automatically generates a new signature when the probe 14 is removed from the circuit and placed on another node.

A block diagram of the signature analysis system 10 is illustrated in FIG. 2. The system 10 includes a data acquisition circuit 100 which receives the START, STOP, CLOCK and ENABLE signals through a control pod circuit 102 in the pod 16 as well as a digital signal from a node of the circuit under test from a probe circuit 104 in the probe 14. The data acquisition circuit 100 computes the signature and counts the number of transitions occurring during the gate period. The signature and transition count are applied to a controller circuit 106, containing an internal microprocessor, which compares them to a table of signatures and transition counts in a read-only memory 107. The controller circuit 106 also receives data from and applies data to a front panel key-display circuit 108.

The control pod circuit 102, which is illustrated in detail in FIG. 3, includes threshold circuits 120a–d to which the STOP, START, $\overline{\text{ENABLE}}$ and CLOCK signals are applied. The signals are applied through resistors 122,124 to the positive input of a comparator 126, which has its negative input connected to a reference voltage. A capacitor 128 is connected in parallel with resistor 124 to minimize the rise and fall timees of the signals applied to the comparator 126. Diode 130 clips negative voltages applied to the inputs of the threshold circuits 120a–d so that they respond only to positive inputs. Thus the outputs of the comparators 126 go high whenever a voltage applied to their respective inputs exceeds the reference voltage applied to the negative input of the comparators 126a–d.

The reference voltage is generated by a voltage follower operational amplifier 132 having its input connected between voltage divider resistors 134,136. Operational amplifier 132 thus provides a voltage reference source having a low output impedence. Capacitor 138 is also provided to lower the high-frequency impedance of the source.

The comparators 126a–c also contain a CLOCK input which, being continuously grounded, allows the comparators 126a–c to function. However, the comparator 126d of threshold circuit 120d is connected to the $\overline{\text{Q}}$ output of ENABLE threshold circuit 120c through switch 140. Thus, when switch 140 is in the position indicated, CLOCK comparator 126d is disabled whenever the $\overline{\text{ENABLE}}$ input is low, thus causing the $\overline{\text{Q}}$ output of circuit 120c to be high. Otherwise, the output is held low through resistor 142. The enable function may be switched off by closing switch 140, thereby continuously applying a ground to the $\overline{\text{Q}}$ input of comparator 126d.

The outputs of threshold circuits 28a,b and d are applied to respective polarity reversal switches 144, 146 and 148. The polarity reversal switches 144–148 are actuated to allow the system 10 to respond to either the inverted or noninverted STOP, START and CLOCk signals. The control pod circuit 108 thus generates respective complementary signals STOP, START and CLOCK, with the CLOCK outputs being disabled whenever the $\overline{\text{ENABLE}}$ input is high.

The data probe circuit 104, illustrated in FIG. 4, performs basically two functions. First, it establishes high and low thresholds for the incoming data signal and determines whether the signal is above or below these thresholds. Second, it selectively illuminates light-emitting diodes on the probe to indicate the status of a signature analysis.

The incoming digital signal is applied through resistor 150 to the negative input of comparator 152 and the positive input of comparator 154. Capacitor 156, connected in parallel with resistor 150, increases the high-frequency response of the circuit to minimize the rise and fall times of the digital signal as it is applied to the comparators 152,154. A diode 158, connected between the inputs of comparators 152,154 and ground, clamps negative inputs applied to the comparators 152,154.

The positive input of comparator 152 and the negative input of comparator 154 receive respective reference voltages generated by voltage divider resistors 160,162 and potentiometer 164. Thus a positive reference voltage is applied to the positive input of comparator 152 and a lower positive voltage is applied to the negative input of comparator 154. The voltage on the probe in its floating condition is set to some voltage between the high and low voltage references by the wiper of potentiometer 164 through resistor 166. Resistor 168 is connected in parallel with potentiometer 164 so that the position of the wiper of potentiometer 164 and the incoming digital signal do not affect the reference voltages.

In operation, the Q output of comparator 152 goes high (and the $\overline{\text{Q}}$ output of comparator 152 goes low) whenever the incoming digital signal exceeds the high voltage reference signal applied to the positive input of comparator 152. Similarly, the Q output of comparator 154 goes high (and the $\overline{\text{Q}}$ output of comparator 154 goes low) whenever the incoming digital signal has a voltage lower than that of the low voltage reference applied to the negative input of comparator 154. Thus, connecting the data probe to a floating circuit node does not produce erroneous indications that the node is either logic high or logic low.

As mentioned above, the data probe circuit 104 also illuminates indicating lamps on the probe. Accordingly, light-emitting diodes 170,172,174,176,178, which indicate various analysis responses, have their anodes connected to a common positive voltage and their cathodes connected to respective outputs of a shift register 180. Shift register 180 has a CLOCK input connected to an externally generated clock and a data input connected to either an externally generated RESET signal or the reset switch 40 (FIG. 1). Individual light-emitting diodes 170-178 are illuminated by generating a RESET high and then clocking the resultant low to the proper output to ground the cathode of the selected light-emitting diode. All of the light-emitting diodes 170,178 may be illuminated by manually actuating the reset switch 40 on the probe, thereby setting all outputs of the shift register 180 to a low.

Figure 5A:
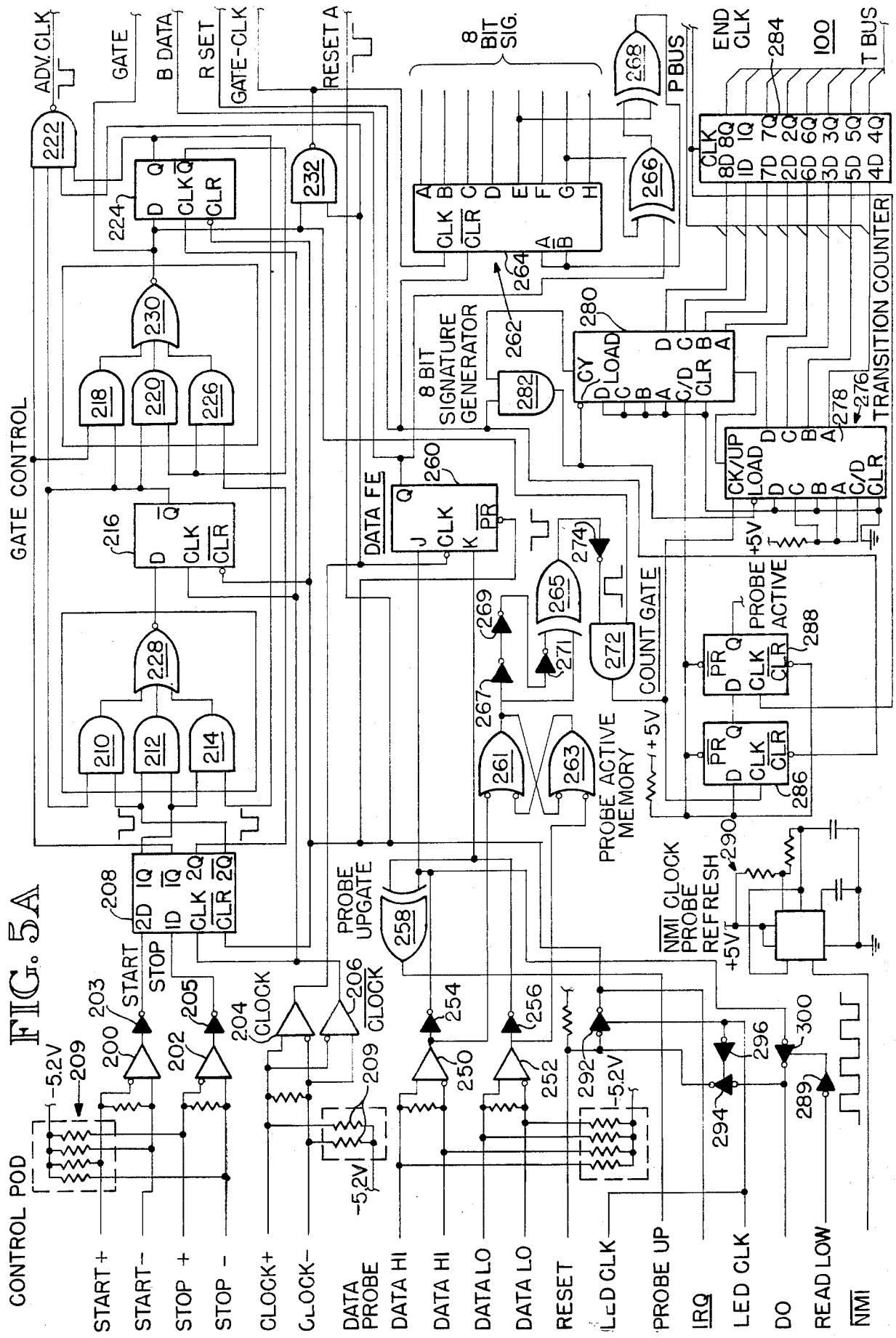
FIG. 5 is a schematic of the data acquisition circuitry that receives signals from the control pod and data probe, generates a signature corresponding to the digital signal connected to the probe, and counts the number of transitions occurring during the sample period.

The data acquisition circuitry 100, illustrated in FIG. 5, receives the outputs from the control pod circuit 102, which are applied to comparators 200-206. The inputs to the comparators 200-206 are pulled low through resistors 209. The outputs of comparators 200,202 are inverted by respective inverters 203,205 and applied to respective inputs of a dual flip-flop 208. The CLOCK signal at the output of comparator 204 is applied to the CLOCK input of flip-flip 208 and to the CLOCK inputs of other flip-flops described hereinafter.

The circuitry connected to the output of flip-flop 208 generates a GATE signal during the period occurring after the START pulse and before the STOP pulse. Basically, it responds to a START pulse only after a STOP pulse has previously occurred so that subsequent transitions of the START signal do not affect the operation of the circuit. Flip-flop 208 is initially cleared by an externally generated $\overline{\text{RESET A}}$ signal, thereby applying a high to AND-gates 210 and 212 from the $\overline{2Q}$ output of the flip-flop 208 and applying a low to AND-gate 212 and AND-gate 214 from the $\overline{1Q}$ output of flip-flop 208. Flip-flop 216 is also initially cleared by the $\overline{\text{RESET A}}$ signal so that its $\overline{Q}$ output enables AND-gate 210, AND-gate 218 and AND-gate 220, and partially enables NAND-gate 222. At the same time, NAND-gate 222 and AND-gate 218 receive a high from the 1Q output of flip-flop 208. A third flip-flop 224, also initially cleared by the $\overline{\text{RESET A}}$ signal, disables NAND-gate 222 and AND-gate 214 with a low at its Q output. The remaining input of NAND-gate 222 receives the inverted CLOCK signal from comparator 206. NAND-gate 222 is thus, at this time, disabled solely by flip-flop 224, which through its $\overline{Q}$ output, enables AND-gate 220 as well as AND-gate 226. Under these circumstances, NOR-gate 228 receives a high from AND-gate 210, a low from AND-gate 212, and a low from AND-gate 214. NOR-gate 228 thus applies a low to the input of flip-flop 216. However, it will be noted that if either input to AND-gate 210 goes low, the output of NOR-gate 228 will go high.

By this time, NOR-gate 230 receives a high from AND-gate 218, a high from AND-gate 220, and a low from AND-gate 226, thereby applying a low to the input of flip-flop 224. The above-described circuitry is in a stable state under these conditions and will remain as described above as CLOCK pulses are applied to the flip-flops 208,216,224 by the comparator 204.

When a START pulse is generated at the output of inverter 204, the $\overline{2Q}$ output of flip-flop 208 goes low, thereby (1) causing NOR-gate 228 to apply a high to the input of flip-flop 216 through AND-gates 210,212, and (2) disabling AND-gate 212 so that it will not respond to a high at the 1Q output of flip-flop 208 generated by a STOP pulse, as explained hereinafter. The START pulse also causes a high to be generated at the output of AND-gate 226 through a high at the Q output of flip-flop 208.

Upon the leading edge of the next CLOCK pulse, the high at the data input of flip-flop 216 causes a low to be generated at its $\overline{Q}$ output. This low (1) disables AND-gate 210 so that it cannot respond to subsequent START pulses, (2) causes the outputs of AND-gates 218 and 220 to go low, thereby enabling the output of NOR-gate 230 to go high upon receiving a low from AND-gate 226, and (3) disables NAND-gate 222.

The circuitry remains in a stable state as long as the START pulse is present since the high at the input of AND-gate 226 holds the output of NOR-gate 230 low. However, on the leading edge of the CLOCK pulse subsequent to the trailing edge of the START pulse, the $\overline{2Q}$ output of flip-flop 208 goes high, AND-gate 226 goes high, causing NOR-gate 230 to apply a high to flip-flop 224 and generate a positive-going GATE signal which enables NAND-gate 232 so that a GATE CLK signal is generated as the inverted CLOCK output from comparator 206. The high at the output of NOR-gate 230 at the termination of the START pulse also enables NAND-gate 222 so that the inverted clock from comparator 206 generates an ADV CLK pulse. The $\overline{2Q}$ output of flip-flop 208 also enables AND-gates 210,212 so that a STOP pulse causes NOR-gate 228 to apply a low to flip-flop 216, as explained in greater detail below.

On the leading edge of the next CLOCK pulse, the Q output of flip-flop 224 goes high, thereby enabling NAND-gate 214 so that it can respond to a subsequent STOP pulse. Also, a low at the $\overline{Q}$ output of flip-flop 214 disables AND-gates 220,226 so that they can no longer respond to START pulses. In this condition, the GATE signal can be terminated only by a high generated by AND-gate 218. Thus the GATE signal continues for an indefinite number of clock cycles as long as the STOP pulse does not occur. Moreover, the circuit is insensitive to subsequent transitions of the START signal.

On the leading edge of the CLOCK signal after a STOP signal is generated, the $\overline{1Q}$ output of flip-flop 208 applies a high to enabled AND-gates 212 and 214, thus causing the output of NOR-gate 228 to go low. Also, a low generated at the 1Q output of flip-flop 208 disables AND-gate 218 and NAND-gate 222. Upon the next CLOCK pulse, a high is clocked to the Q output of flip-flop 216, thereby enabling AND-gates 218 and 220 and causing AND-gate 210 to apply a high to NOR-gate 228.

The circuit remains in this condition as long as the STOP pulse is present. However, on the leading edge of the CLOCK signal, after the termination of the STOP signal, a high at the 1Q output of flip-flop 208 causes AND-gate 218 to apply a high to NOR-gate 230, thereby applying a low to the input of flip-flop 224 and terminating the GATE signal. At the same time, NAND-gate 232 is disabled to terminate the GATE CLOCK signal and a low at the 1Q output of flip-flop 208 disables AND-gates 212,214.

Upon the occurrence of the next CLOCK pulse, a low is clocked to the Q output of flip-flop 224, thereby disabling NOR-gate 222 and AND-gate 214 so that it can no longer respond to subsequent STOP signals. At the same time, a high at the $\overline{Q}$ output of flip-flop 224 enables AND-gates 220 and 226, thereby returning the circuitry to its condition subsequent to being initially cleared. The circuitry is thus now able to generate another GATE signal upon the occurrence of the next START pulse, as explained above.

The data acquisition circuitry 100 also receives the signals from the probe circuitry 104. The complementary DATA HIGH signals are applied to comparator 250, while the complementary DATA LOW signals are applied to comparator 252. The outputs of comparators 250,252 are inverted by respective inverters 254,256 and applied to an exclusive OR-gate 258. OR-gate 258 generates a high $\overline{\text{PROBE UP}}$ whenever the probe is determined to be neither logic high (above the high reference voltage, FIG. 4) or logic low (below the low voltage reference, FIG. 4) and is thus floating.

The outputs of inverters 254,256 are also applied to the respective J and K inputs of flip-flop 260, which is clocked by the inverted CLOCK signal at the output of comparator 206. Thus the output of flip-flop 260 is high for high logic level detected by the probe and low for a low logic level detected by the probe. Since the flip-flop 260 responds to high inputs, the output of the flip-flop 260 remains at its previous input when the probe is floating and thus receives a voltage intermediate the high and low logic levels.

The output of the flip-flop 260, which is indicative of the digital signal on the test node, is applied to an eight-bit signature generator 262 formed by a shift register 264 and a pair of exclusive OR-gates 266,268. Exclusive OR-gate 266 receives the data from flip-flop 260 and the seventh stage of the shift register 264. Exclusive OR-gate 268 receives the output of exclusive OR-gate 266 as well as the fifth stage of the shift register 264. The output of exclusive OR-gate 268 is fed back to the input of shift register 264. The SYNC 1 through SYNC 8 outputs of the shift register 264 thus provide an eight-bit signature which identifies the digital signal occurring during the entire gate period. Although the signature at the output of the shift register 264 is composed of eight bits, for accuracy purposes it is really only seven bits since no feedback information comes from the eighth bit. The shift register 264 is cleared by an externally generated RESET signal before each gate period.

The data acquisition circuitry 100 also determines the number of transitions occurring in the digital signal during the GATE period. Accordingly, the outputs of inverters 254,256 toggle a flip-flop formed by NAND-gates 261,263. The output of NAND-gate 260 is applied to an exclusive OR-gate 265 by two parallel paths, one direct and the other through three inverters 267,269,271. The propagation delay of the signal through the inverters 267–271 causes the inputs to the exclusive OR-gate 265 to be unequal for a short period each transition, thus generating a short pulse for each transition which is applied to AND-gate 272 through inverter 274. AND-gate 272 is enabled by the GATE signal during the gate period so that only transitions occurring during the gate period generate COUNT GATE pulses at the output of AND-gate 272.

The output of AND-gate 272 is applied to a transition counter 276 which counts the number of transitions occurring during each gate period. The counter 276 is composed of two stages 278,280. Counter 278 counts up to 15, at which point it increments counter 280 and is then loaded through AND-gate 282 with a preset number. The count from counters 278,280 are reset, in effect, by being applied to a latch 284 which is clocked by an externally generated END CLOCK pulse.

The signature analyzer system includes a circuit for determining whether a node is either active (i.e., transitions occurring) or static in order to detect ground and power lines in a circuit under test. Accordingly, the COUNT GATE signal at the output of AND-gate 272 is also applied to the CLOCK input of a flip-flop 286, which is cleared by the RSET signal at the end of the previous gate period. Thus, at the first transition of the digital signal, a high is clocked to the Q output of flip-flop 286 and this high is clocked to the Q output of flip-flop 288 by the end clock pulse at the end of the gate period. Consequently, a high at the output of flip-flop 288 indicates that an active signal was present at the node under test during the gate period, while a low indicates a static node.

The data acquisition circuitry 100 also includes a conventional oscillator 290 for generating a 10 Hz signal. The signal at the output of the oscillator 290 is used to interrupt a microprocessor, as explained hereinafter, every 0.1 second to refresh the probe's light-emitting diodes.

The $\overline{\text{RESET}}$ terminal of the data acquisition circuitry 100 functions, at various times, as either an input or an output to the data acquisition circuit 100. Accordingly, the $\overline{\text{RESET}}$ line is applied to the input of tri-state buffer 292, having its output connected to the $\overline{\text{IRQ}}$ output. The $\overline{\text{RESET}}$ line is also connected to the output of tri-state buffer 294. Buffer 294 is enabled through inverter 296 by the LED CLK input, while buffer 292 is enabled by that signal directly. Thus the LED CLK input alternately enables buffer 292 or 294, thus determining whether the $\overline{\text{RESET}}$ line is either an input or an output. Where it is an input, it generates an interrup request signal (IRQ) responsive to manually actuating the RESET switch 40 on the data probe 14 (FIG. 1). As an output, the $\overline{\text{RESET}}$ line connects the zero bit D0 of the data bus to the shift register 180 (FIG. 4) to selectively illuminate the light-emitting diodes 170–178.

The data acquisition circuitry 100 also allows the instantaneous value of the digital signal to be output on the zero bit D0 of the data bus. Accordingly, a READ LOW signal applied to inverter 298 enables tri-state buffer 300, thereby connecting the inverted DATA HI signal at the output of inverter 254 to the zero bit D0 of the data bus.

As mentioned above, the B DATA signal at the output of data flip-flop 260 is applied to the eight-bit signature generator 264. The B DATA signal is also applied to a sixteen-bit signature generator. As a result, a total of 24 signature bits is generated, which yields a probability of 1 in 167,777,150 that a signature from the node under test is incorrect and, in reality, is the signature of another node. Under such circumstances, the system would erroneously indicate that the signature on the test node was correct. The probability of error for the inventive 24-bit signature in which the test signature is considered correct if it is identical to *any* correct signature in the circuit is greater than the probability of error for a conventional sixteen-bit signature in which the test signature is considered correct if it is identical to the correct signature for that node. Thus, as compared to commercially available signature analyzers in which signature verification is done on a node-by-node basis, the accuracy of the inventive signature analyzer is not compromised by signature verification on a circuit-wide basis.

Figure 5B:
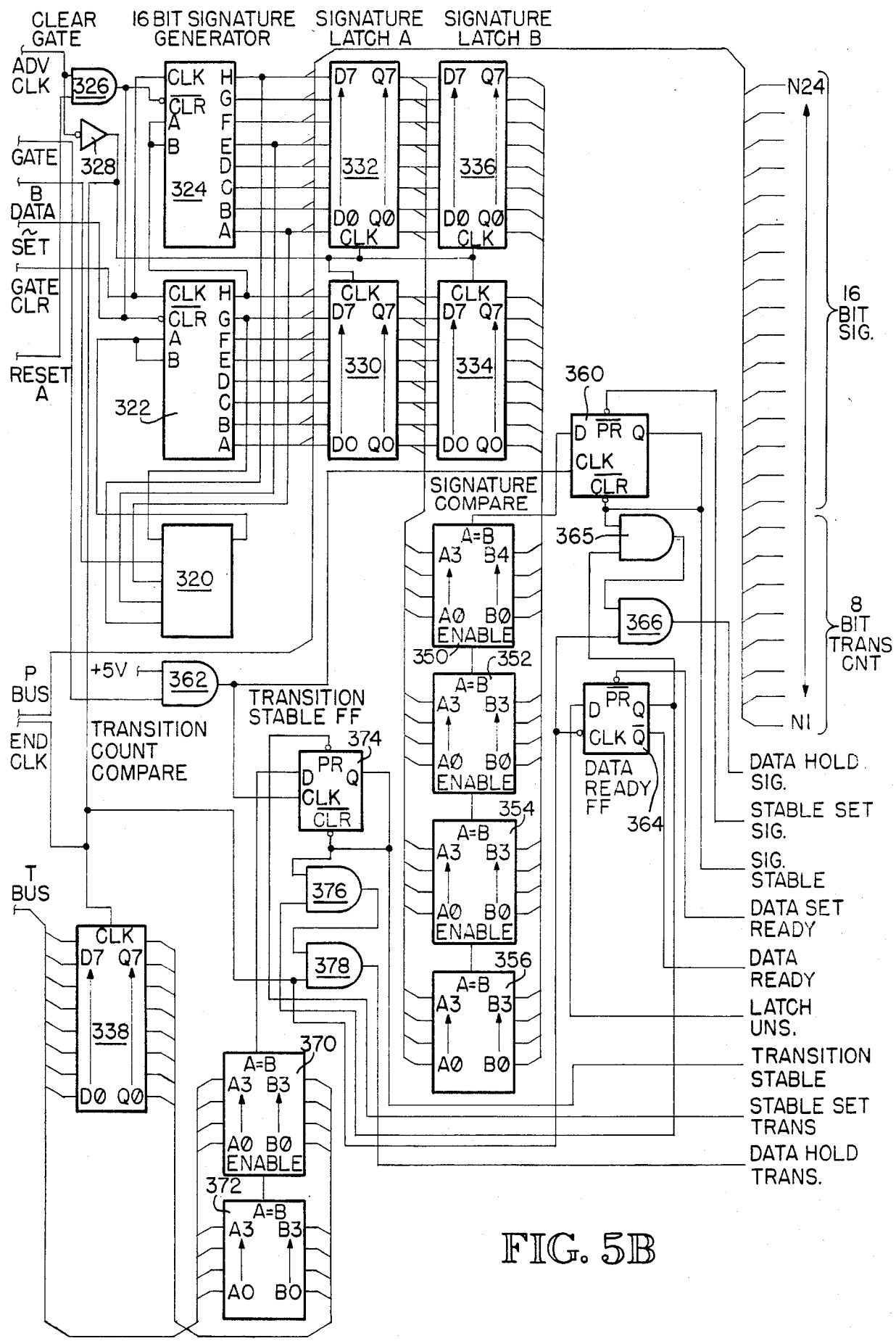

The B DATA output of flip-flop 260, which is indicative of the signal on the test node, is applied to one input of a five-input exclusive OR-gate 320, illustrated in FIG. 5B. The output of the exclusive OR-gate 320 is applied to the input of a shift register 322, which has the output of its final stage connected to the input of a second shift register 324. Bits 7, 9, 12 and 16 of the sixteen-bit shift register are applied to the remaining inputs of the exclusive OR-gate 320. As explained above with reference to the eight-bit signature generator 262, the sixteen-bit signature generator generates a signature identifying the digital signal applied to exclusive OR-gate 320 during the gate period. The shift registers 322,324 are cleared by the ADV CLK pulse through AND-gate 326 at the start of a gate period or by a $\overline{\text{RESET A}}$ when the reset switch 40 on the probe 14 is actuated. The shift registers 322,324 are clocked by the GATE CLK pulses generated by NAND-gate 232 during the gate period. Thus the shift registers 322,324 are cleared before the start of a gate period, they receive the digital signal from the data flip-flop 260 during the gate period, and, at the end of the gate period, they generate a sixteen-bit signature indicative of the digital signal during the gate period.

The ADV CLK pulse is also applied to inverter 238, which generates a positive-going END CLK pulse at the end of the gate period. As mentioned above, the END CLK pulse (1) clears the shift registers 322,324, (2) latches the transition count into latch 284, (3) clocks the probe active flip-flop 288, (4) latches the sixteen-bit signature at the output of shift registers 322,324 into respective latches 330,332, (5) latches the outputs of latches 330,332 into respective latches 334,336, and (6) latches the transition count on the T BUS output of latch 284 into latch 338. As explained in greater detail below, the END CLK pulse also generates a DATA HOLD SIGNATURE pulse and a DATA HOLD TRANSITION pulse in the event that valid signature and transition count data are present.

The outputs of signature latches 334,336 are applied to one set of inputs of comparators 350,352,354,356. The other sets of inputs to the comparators 350,356 receive the previous signature at the output of latches 330,332. The A=B output of comparators 352-356 are applied to the ENABLE input of the subsequent comparator 350-354 so that comparator 350 applies a high to signature stable flip-flop 360 in the event that the signature and the previous signature are equal, thus indicating a stable signature condition. Flip-flop 360, which was previously preset by a negative-going, STABLE SET SIG. pulse remains set as it is clocked by the leading edge of the GATE signal at the output of AND-gate 362. In the event that a signature and the previous signature are not equal, the output of comparator 350 is low, and this low is clocked to the output of flip-flop 360 on the leading edge of the GATE pulse. The low at the output of flip-flop 360 is applied to its $\overline{\text{CLR}}$ input so that flip-flop 360 remains cleared until preset by the microprocessor. As a result, the central processing unit in the controller circuit 106 need not continuously monitor the status of flip-flop 360 to determine if an unstable signature condition has occurred.

The Q output of the flip-flop 360 also causes AND-gate 365 to generate a high in the event of a stable signature condition. AND-gate 365 also receives the Q output of flip-flop 364 which is preset high by a negative-going $\overline{\text{DATA SET READY}}$ before the start of a gate period. The output of flip-flop 364 remains high to enable AND-gate 366 through AND-gate 362. Thus, in the event of a stable signature, flip-flop 364 remains set to generate a high Q output so that the END CLK pulse is transmitted through AND-gate 366 to generate a positive-going DATA HOLD SIGNATURE pulse. This pulse clocks the latest signature into latches 300, 302, and 314 on the controller board.

The circuitry for processing the transition count data is substantially identical to the above-described circuitry for processing the signature. Accordingly, the transition count on the T BUS at the output of latch 284 is applied to one set of inputs of comparators 370,372. The transition count for the previous gate period at the output of latch 338 is applied to the second set of inputs to the comparators 370,372. If the present transition count is equal to the previous transition count, the A=B output of the comparator 370 is high. This output is applied to the input of flip-flop 374, which has previously been preset by an externally generated stable SET TRANSITION pulse. Thus, if the transition count is stable (i.e., not changing from gate period to gate period), flip-flop 374 remains set. However, if an unstable transition count occurs, the output of comparator 370 goes low, and this low is clocked to the output of flip-flop 374 at the leading edge of the next gate pulse. The flip-flop 374 is then latched in a CLEAR mode since the low at the output of flip-flop 374 is applied to the $\overline{\text{CLR}}$ input. The low also disables AND-gate 376.

Assuming that the transition count is stable, the output of flip-flop 374 remains high, thereby enabling AND-gate 376. Assuming that the Q output of flip-flop 364 is high, AND-gate 376 enables AND-gate 378 so that a positive-going DATA HOLD TRANS. pulse is generated by the END CLK pulse to indicate the presence of a stable transition count on outputs N17-N24 of the data acquisition circuit.

The data-ready flip-flop 364 performs the handshake between the data acquisition board and the microprocessor. The microprocessor presets the flip-flop 364, and it is set to a low after the rising edge of END CLK. If the latch unstable mode is selected, the LATCH UNS will be high and the output of flip-flop 364 will remain high, disabling the handshake with the microprocessor and allowing the data acquisition circuit to free run until the incidence of an unstable signature. If two consecutive signatures or transition counts don't compare, the outputs of comparators 370 and 350 will go low and the rising edge of END CLK will clock a LOW into flip-flops 374 and 360. The DATA HOLD SIG. pulse and the DATA HOLD TRANS. pulse will clock the latest signature and transition count into latches 300, 302, 304, and 314. Further clocking of these latches will be inhibited until flip-flops 364 and 374 are preset by the microprocessor.

Figure 6A:
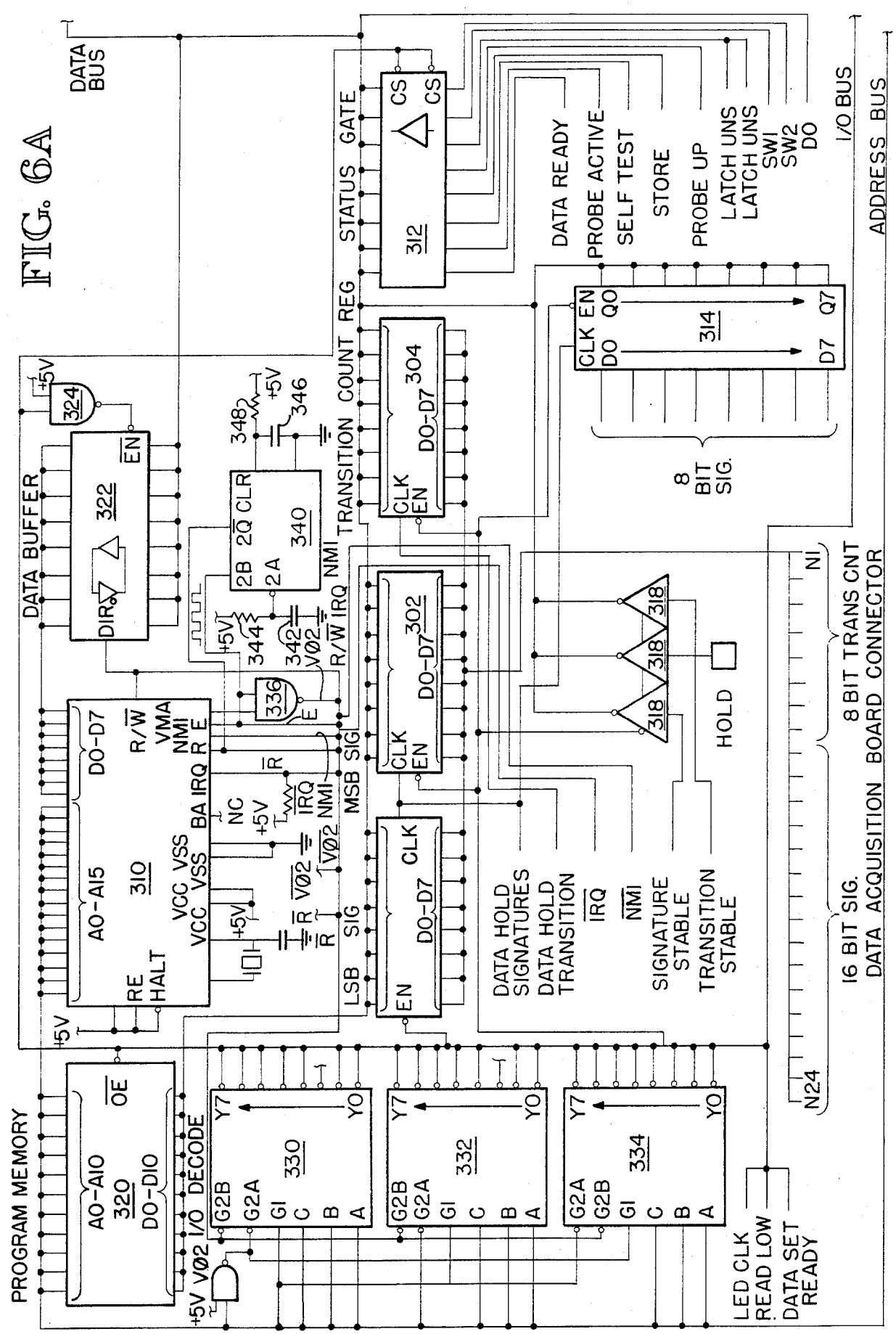
FIG. 6 is a schematic of the controller board that contains a microprocess for controlling the operation of the system and displaying the results of a signature analysis.

The controller circuit 106, illustrated in FIG. 6, receives the signatures and transition counts from the data acquisition circuit 100. The sixteen-bit signature is latched into respective latches 300,302 by the DATA HOLD SIGNATURES pulse generated at the output of AND-gate 366 (FIG. 5). The eight-bit transition count is latched into latch 304 by the DATA HOLD TRANSITION pulse generated at the output of AND-gate 378 (FIG. 5). The outputs of latches 300-304 are applied to the data bus of a microprocessor 310 whenever the latches 300-304 are selectively enabled by respective bits of the address bus of microprocessor 310. The data bus also receives a status word from buffers 312 and 318 indicative of various signals to allow the microprocessor 310 to process such signals.

The eight-bit signature of the output of shift register 264 (FIG. 5) is also written into latch 314 by the DATA HOLD SIGNATURE pulse and applied to the data bus when the latch 314 is enabled. The data bus also receives program steps from a read-only memory 320 as determined by the address bus to control the operation of the microprocessor 310. The data bus is connected to the data bus of the microprocessor 310 through bidirectional bus 322, which is disabled by NAND-gate 324 when the microprocessor 310 is accessing its 120 bytes of internal random-access memory. The direction of the buffers 322 is controlled by the READ/WRITE output of the microprocessor 310.

The ENABLES for the latches 300,302,304,314, the program memory 320, the buffers 312,318,322, as well as the LED CLK, READ LOW, and $\overline{\text{DATA SET READY}}$ signals are generated by decoders 330,332,334 from the address bus of the microprocessor 310. The decoders are enabled by the $\overline{\text{VO2}}$ signal at the output of NAND-gate 336 when the NAND-gate 336 is enabled by a high at the VMA output of the microprocessor 310 and a CLOCK pulse is generated at the E output of the microprocessor 310.

The CLOCK signal at the E output of microprocessor 310 is also applied to one input of a one-shot 340. The other input to one-shot 340 is held low when power is initially applied to the system until capacitor 342 charges to a predetermined voltage through resistor 344. The timing of one-shot 340, determined by capacitor 346 and resistor 348, is such that the output of the one-shot 340 remains low until the 2A input reaches a predetermined voltage and the 2B input goes high. Thus one-shot 340 remains low until the system powers up and until the microprocessor 310 generates CLOCK signals at its E output. The timing of capacitor 346 and resistor 348 is such that the period of the one-shot 340 is longer than the period of the CLOCK pulses at the output of the microprocessor 310. Consequently, once power has been applied to the system and the CLOCK pulses are being generated by the microprocessor 310, the output of one-shot 340 remains low. The output of one-shot 340 holds the microprocessor 310 in a reset condition during the start-up period of the microprocessor 310 and it also resets other portions of the controller circuit 106, as explained hereinafter.

Figure 6B:
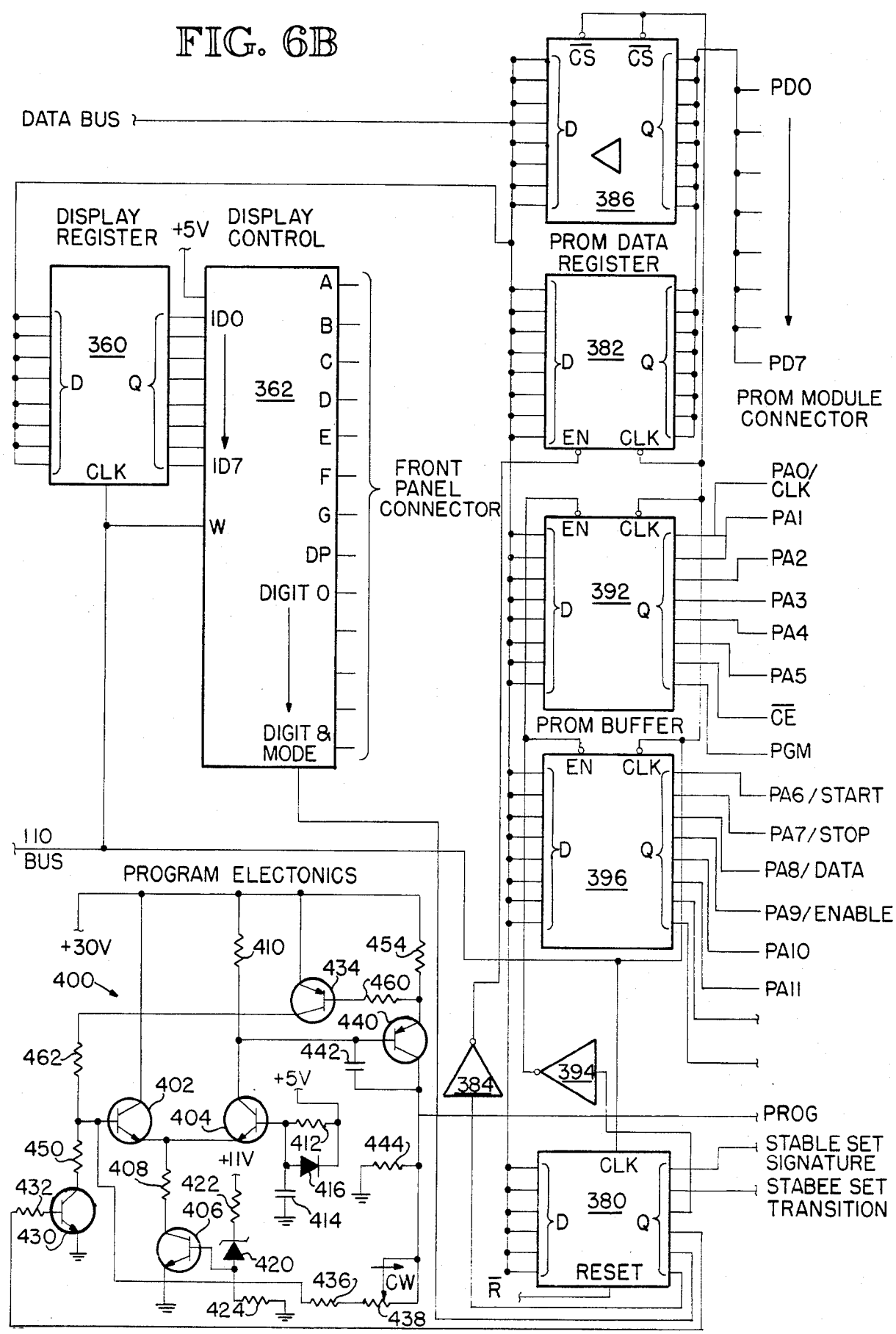

The remainder of the controller circuit 106, illustrated in FIG. 6B, interfaces with the front panel key-display circuit 108 and the signature PROM module 106. Signature or transition count data to be displayed is applied to a display register 360, which, in turn, applies the data to the control inputs of a conventional display controller circuit 362. The incoming data is written into the circuit 362 responsive to a positive-going WRITE pulse applied to the W input of the control circuit 362. The control circuit 362 is a programmable device that, once programmed, repetitively generates appropriate signals for selectively illuminating the seven segments of each digit of the display in sequence. Thus, to display four digits, four bytes of data are written into the controller circuit 362. A signal applied to the mode input of the circuit 362 identifies the start of a display word so that the circuit 362 can determine to which digit the display word corresponds.

The circuitry connected to the PROM module circuitry 106 is controlled by a latch 380 connected to the data bus, which is clocked by a bit of the I/O bus. The latch 380 thus generates the STABLE SET SIGNATURE pulse applied to the preset input of flip-flop 360 (FIG. 5) and the STABLE SET TRANSITION pulse applied to the preset input of flip-flop 374 (FIG. 5). The latch 380 also applies an ENABLE signal for a PROM data register 382 through inverter 384. The PROM data register records the output of the PROM module circuit 106 upon receipt of a CLOCK pulse from I/O bus and it applies the output to the data bus responsive to the ENABLE signal from inverter 384. The output of the PROM module circuit may also be applied to the data bus through a buffer 386 responsive to receipt of a CHIP-SELECT signal from a bit of the I/O bus. The buffer 386 and register 382 are used to read and write signatures and transition counts to and from a table of signatures and transition counts corresponding to the circuit under test. The address of the signature is provided by buffers 392 and 396 when enabled by the latch 380 through inverter 394. The address is entered into the buffers 392 and 396 from the data bus when the buffers are clocked by a bit of the I/O bus.

As mentioned above, the PROM in the PROM module circuit may be programmed in two modes. First, it may be programmed with a conventional PROM programmer. Alternatively, it may be programmed by the signature analysis system utilizing a circuit known to be operating correctly. In this later mode, the STORE switch (FIG. 1) is actuated and the probe is applied to each node of the circuit under test. The signatures for each node during the gate period are then stored in the PROM. The PROM is enabled by an output from buffer 392. Buffer 392 also generates a PGM signal whenever the PROM is to be programmed. The signal for actually writing the data into the PROM is generated as a PROG signal which is normally five volts but rises to twenty-five volts to write data. This signal is generated by a programming circuit 400 which is controlled by an output of the latch 380. The programmer circuit 400 includes a pair of transistors 402,404 connected to the collector of transistor 406 through resistor 408, which acts as a current sink. The transistors 402,404 form a differential amplifier, the output of which is generated across resistor 410. The base of transistor 404 receives a +5 volt reference through resistor 412. A capacitor 414 connected between the base of transistor 404 and ground maintains transistor 404 at cutoff when power is initially applied in order to prevent spurious data from being written into the PROM before the system is stabilized. Diode 416 discharges the capacitor 414 as soon as power is removed, also to prevent spurious data from being written into the PROM. Similarly, a zener diode 420 is connected in series with current reference transistors 422,424 so that the current sync transistor 406 is cut off as soon as power is removed.

When a PROM is not being programmed, latch 380 applies a low to the base of transistor 430 through resistor 432. Also, as long as the current supplied to the PROM does not exceed a predetermined value, transistor 434 is at cutoff, as explained in greater detail hereinafter. Thus, under these circumstances, the only input to transistor 402 is a feedback signal applied through resistor 436 and potentiometer 438. Potentiometer 438 is adjusted so that the voltage on the collector of transistor 440 equals five volts. In the event that the load on transistor 440 increases, thereby tending to reduce the voltage at the output, the voltage applied to the base of transistor 402 correspondingly decreases. As a result, the current flowing through transistor 402 decreases, while the current flowing through transistor 404 correspondingly increases. This causes a decrease in the voltage on the collector of transistor 404, which increases the current flowing through transistor 440 to raise the voltage at its collector to the predetermined value. Capacitor 442 is connected across the base and collector of transistor 440 to stabilize the circuit, and resistor 444 is provided to load the output to prevent an open-loop condition. The circuit, as thus described, operates as a negative feedback, constant voltage source.

When the PROM is to be programmed, latch 380 applies a high to the base of transistor 430 through resistor 432, thereby pulling the base of transistor 402 low through resistor 450. The current flowing through transistor 402 thus greatly decreases, causing a corresponding increase in the current flowing through transistor 404. Transistor 440 is then driven toward saturation so that the entire thirty-volt supply voltage is applied to the PROG output through resistor 454. The feedback path through resistors 436 and 438 is now unable to reduce the output voltage since the feedback signal is shunted by transistor 430. Transistor 440 thus provides sufficient power to program the PROM. In the event that the current supplied to the PROM exceeds a predetermined value (e.g., 0.6 amps), a sufficient voltage is generated across resistor 454 to drive transistor 434 out of cutoff through resistor 460. Transistor 434 then applies a relatively high voltage to the base of transistor 402 through resistor 462, thereby causing a relatively large amount of current to flow through transistor 402. The current flowing through transistor 404 then undergoes a corresponding decrease, which causes a reduction in the current flowing through transistor 440 and a corresponding decrease in the output voltage at the collector of transistor 440. The programmer circuit 400 thus generates a regulated, current-limited output of either five or twenty-five volts, depending upon the value of the signal applied by the latch 380 to the circuit 400.

Figure 7:
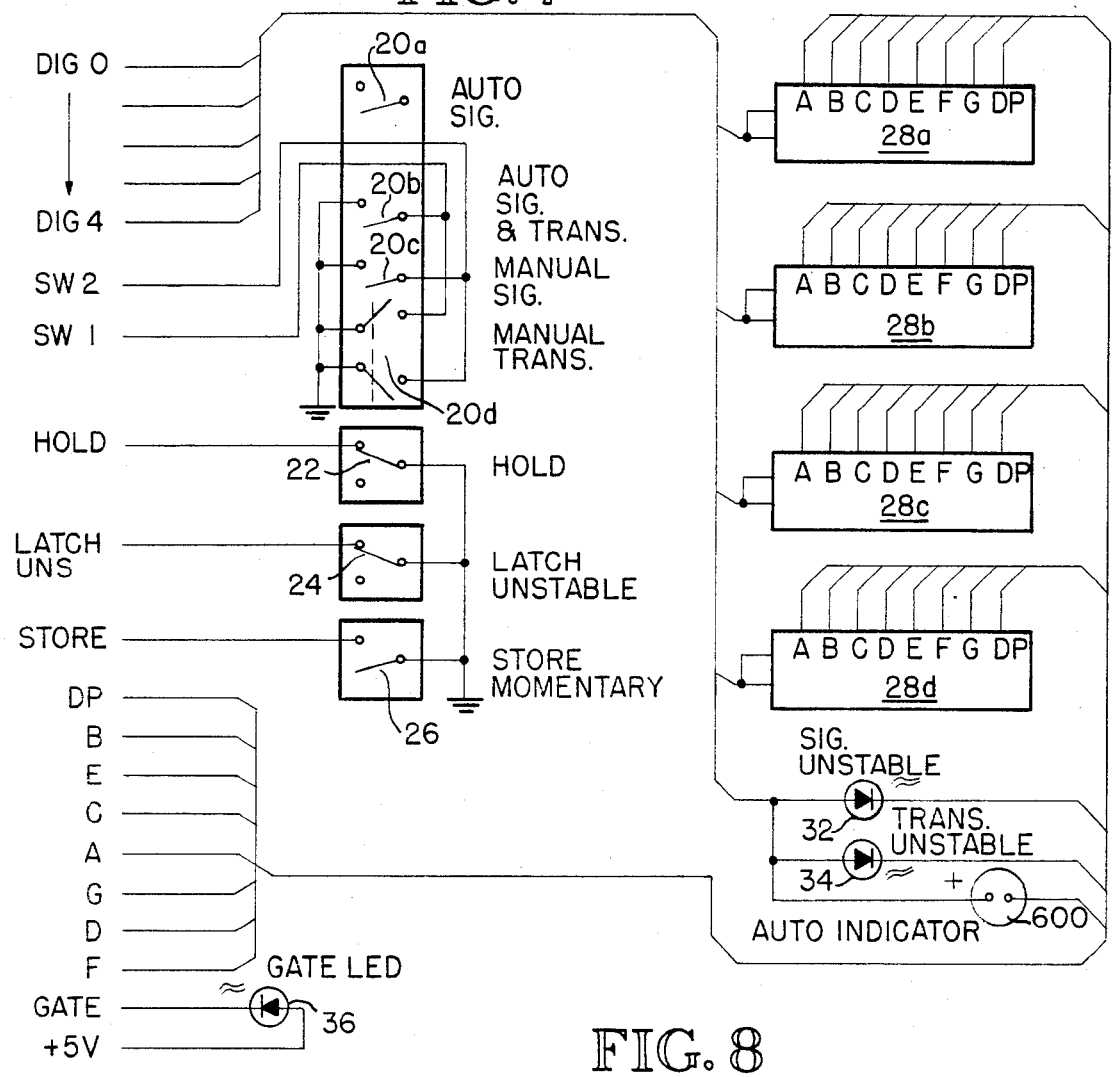
FIG. 7 is a schematic of the front panel control board of the signature analysis system.

The DIGIT 0-3 outputs of the display controller circuit 362 are applied to respective digits of the four-digit, seven-segment displays 28a-d, as illustrated in FIG. 7. The A-G and DP outputs of the display controller circuit 362 are applied to respective segments of all of the digits of the display 28a-d. The A-G outputs of the controller circuit 362 thus apply the same control signal to all of the digits 28a-d, but only one digit is enabled by the DIGIT 0-3 outputs at a time. Thus four different hexedecimal words are displayed on the display 28a-d which are indicative of sixteen bits of the signature. It should be emphasized, however, that although only sixteen bits are displayed, the comparison of the test signature with the stored signature is made on a 24-bit basis.

The signature unstable LED 32 (FIG. 1), transition unstable LED, and an audio signaling device 600 are enabled in sequence by the DIG4 input to the front panel circuit. When enabled, either or all of the LEDs 32,34 and the signaling device 600 are energized by applying appropriate signals to the d, e, and a inputs of the circuit. The gate LED 36 is energized directly by the GATE signal.

The mode switches 20a-d are mechanically interconnected so that only one of them may be closed at any time. The switches 20a-d are connected to SW1 and SW2 outputs so that a two-bit binary word is generated indicative of the selected mode. Thus, the auto-signature mode generates a "11", the auto-signature and transitions mode generates a "10", the manual signature mode generates a "01", and the manual transitions mode generates a "00". The hold switch 22, latch unstable switch 24, and store switch 26 each generate respective HOLD, LATCH UNS, and STORE outputs, which are used by the remainder of the circuitry as explained above.

Figure 8:
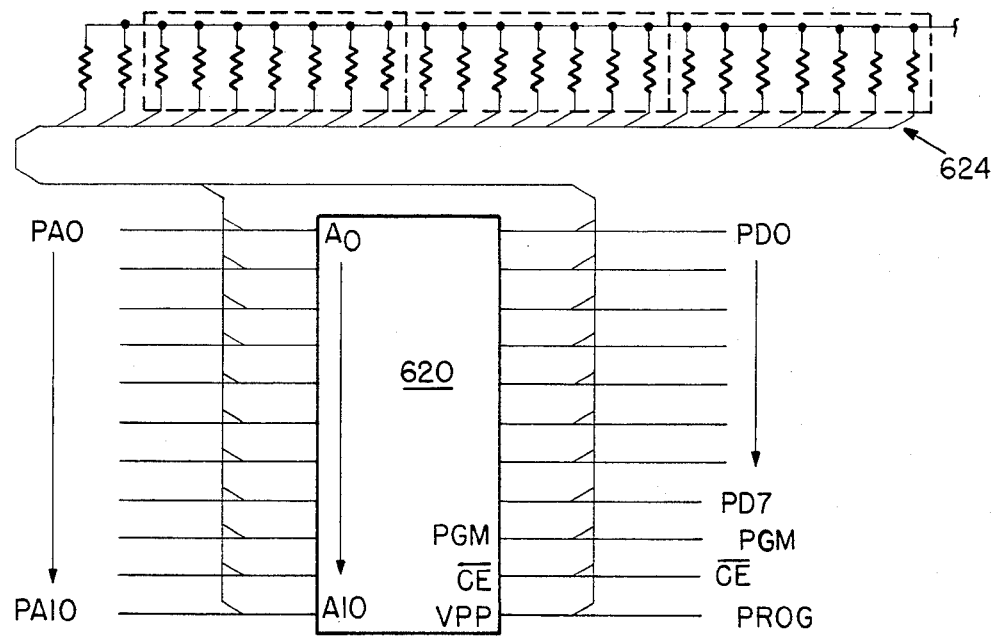
FIG. 8 is a schematic of the programmable read-only memory module for storing signatures applicable to the circuit under test.

The final portion of the signature analysis system is the signature PROM module circuit 107 illustrated in FIG. 8. Basically, this circuit includes a programmable read-only memory (PROM) 620 having address inputs connected to the PA0-PA10 outputs of the controller circuit 106 and data inputs/outputs PD0-PD7 connected to the controller circuit 106. The PROM 620 also receives the PGM signal for indicating that the PROM 620 is to be programmed, a $\overline{\text{CE}}$ signal enabling the PROM, and the PROG signal, which is normally five volts but rises to twenty-five volts to program the PROM. The address inputs to the PROM 620 are held high when not addressed through pull-up resistors 624.

Figure 9A:
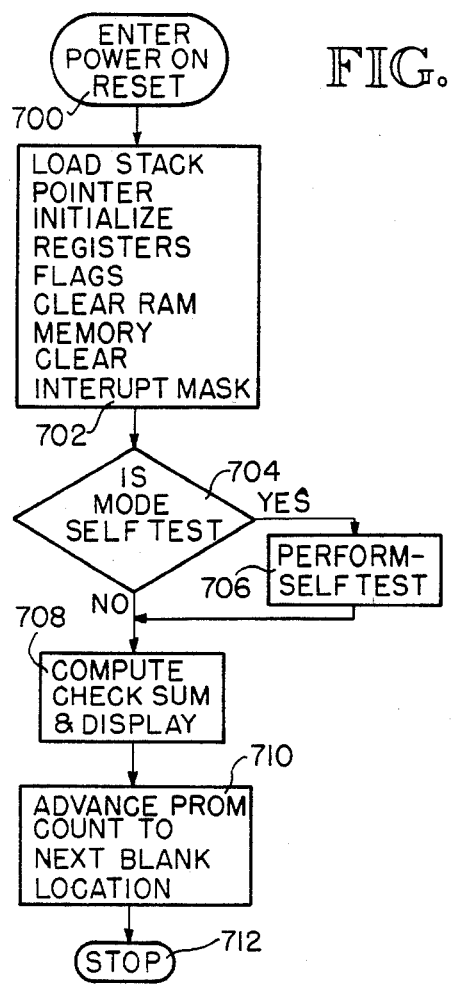
FIG. 9 is a flow chart of the program for controlling the operation of the signature analysis system.
Figure 9B:
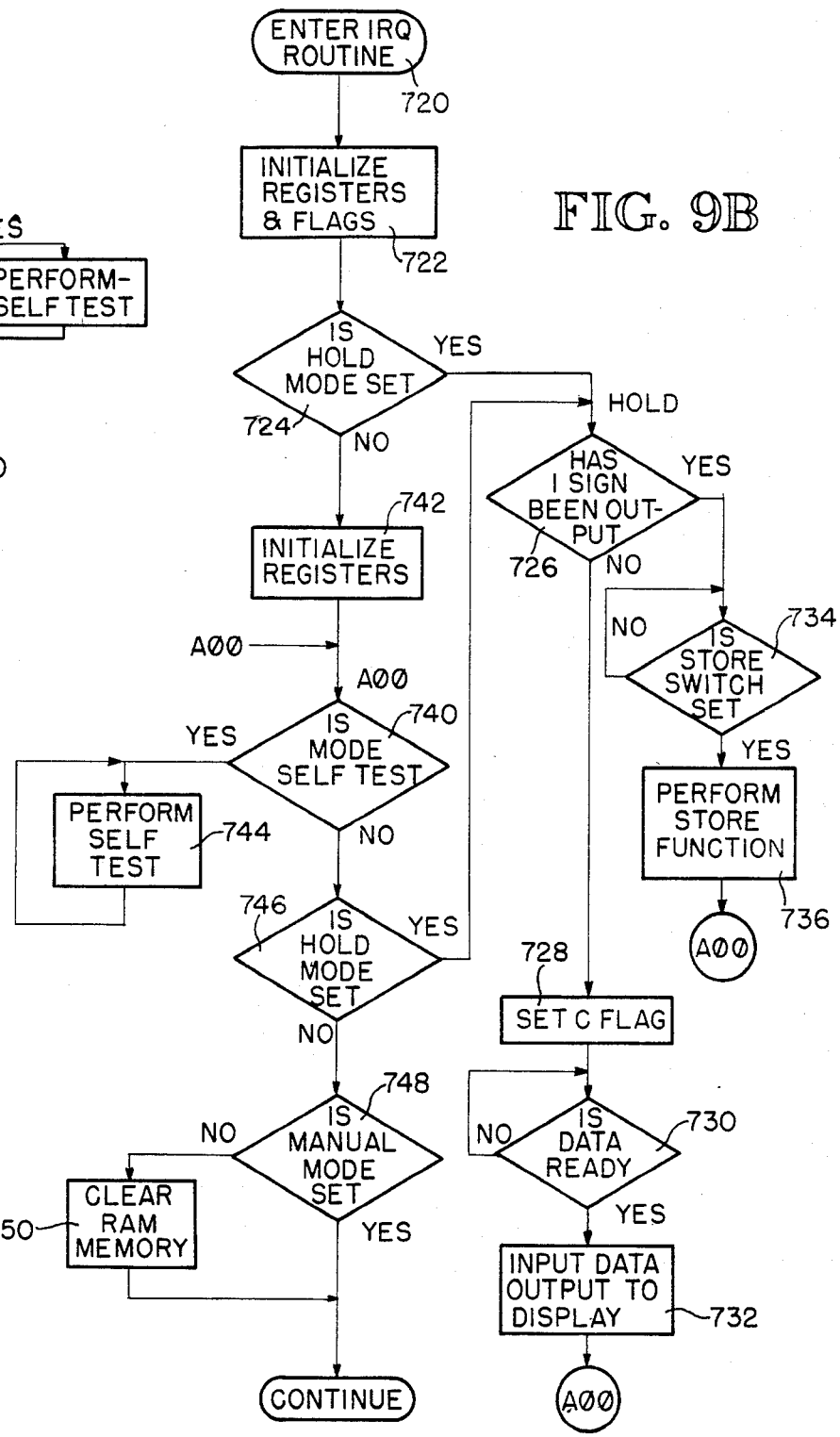
Figures 9C, 9D:
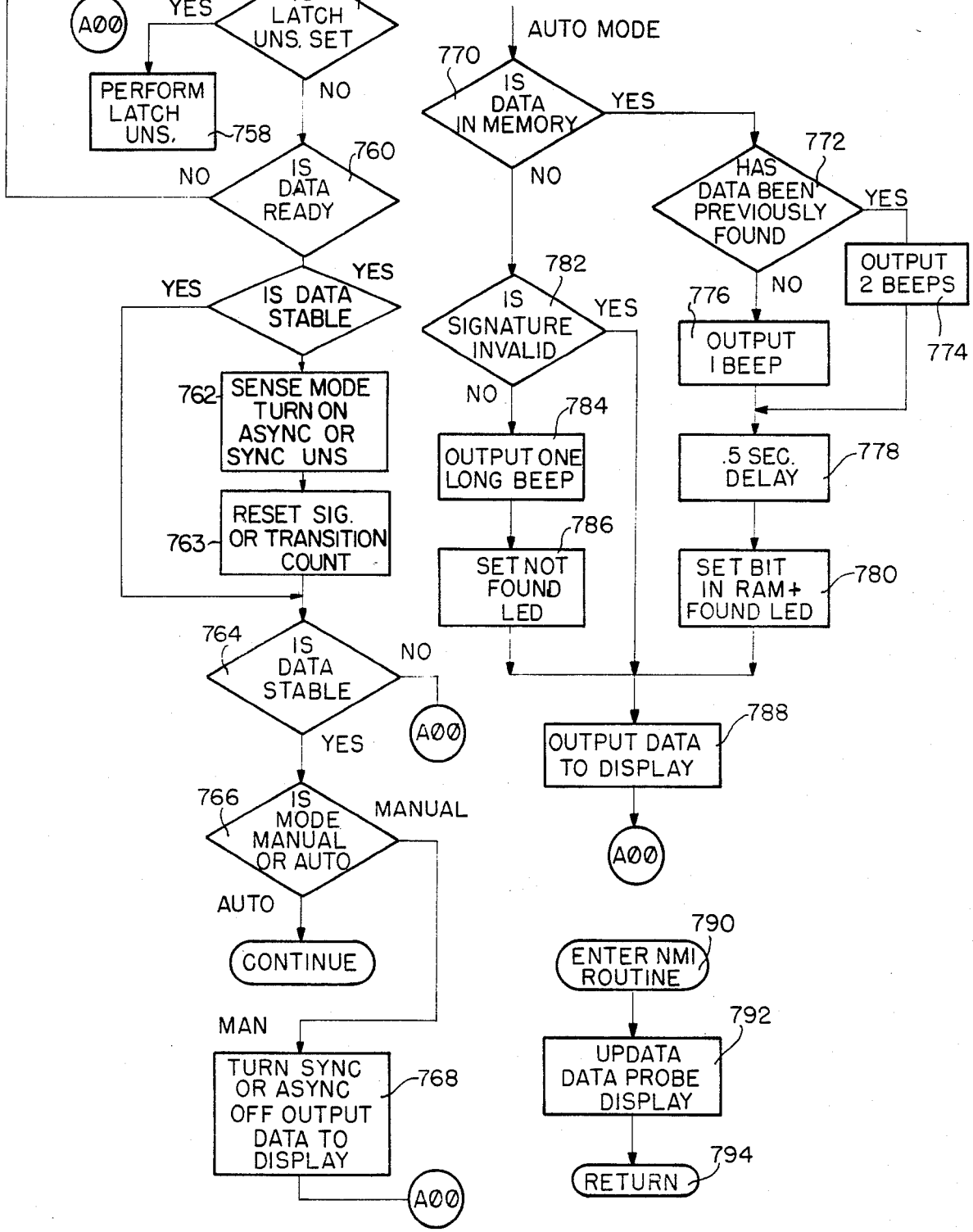

A flow chart for controlling the operation of the microprocessor is illustrated in FIG. 9. The program is initially entered at 700 as a power-on reset generated by the one-shot 340 (FIG. 6) when power is initially applied to the system. A number of initialization functions are then accomplished at 302 to set up the program for execution. Specifically, an internal stack pointer is loaded to identify the location of temporary storage, internal registers and flags are initialized, internal random-access memory is cleared, and an interrupt mask is cleared to allow interrupts to be serviced. The program then proceeds to 708, where the binary sum of all the data in the PROM 620 is calculated to provide an identification of such data. The binary sum thus identifies a PROM for use with a specific circuit under test. Finally, the address of the PROM is advanced to the next location at 710 so that, in the "Store" mode, the next signature can be recorded. The program then stops at 712 and awaits an interrupt, as explained hereinafter.

The microprocessor is adapted to operate in an interrupt mode, in which an $\overline{\text{IRQ}}$ interrupt request signal is generated at the output of buffer 292 (FIG. 5) whenever a $\overline{\text{RESET}}$ signal is generated by manually actuating the reset switch 182 (FIG. 4) on the probe. The microprocessor 310 then enters an interrupt request routine at 720, in which registers and flags are initialized at 722. The program then determines at 724 if the hold mode has been set, in which case the signature is continuously displayed until the manual reset button 40 on the probe 14 is actuated, as explained above. If the hold mode has been selected, the program proceeds to 726, where it determines if a signature has been output. If not, the program proceeds to 730, where it remains until data is ready. Data is then output to the display at 732, and the program branches to 746. Since the hold mode is set (as previously determined at 724), the program returns to 726. If a signature has still not been output, the program once again waits for data at 730 and outputs it at 732 before once again looping through 746, 726 and 730. The program remains in this loop until a signature has been found to be output at 726, in which case the status of the store switch 26 is determined at 734. The program continues monitoring the store switch until it is set, at which time the program performs a store function at 736. The program then jumps to 746 and progresses back to 736 through 726 and 734. The program remains in this loop until the manual reset switch 40 on the probe 14 is actuated, thereby returning the program to 720.

If the program determines at 746 that the Hold mode has been selected, the program proceeds to 748, where the presence of a manual mode selection is tested. If the manual mode has been selected, signature found memory is cleared at 750 before continuing to 752, where the condition of the store switch is tested. The signature found memory is a portion of RAM that records that a signature on a node of the circuit under test is recorded in the PROM 620 so that the system does not record the same signature twice when it is in the store mode and so that it can indicate that a node has been tested twice. This memory is reset at 750 because it is not used in the manual mode. If the manual mode has been found to be selected at 748, the program proceeds directly to 752.

If the store switch is set, a signature is stored in the PROM at 754 before returning to 746. In operation, the program at 754 first displays the signature on the node of the circuit under test. The store switch 26 is then actuated, thereby causing the next address in PROM 620 to be displayed. This address corresponds to the number of signatures that have been stored, thereby providing verification that all signatures have been entered into the system because the number of circuit nodes will be known. The store switch 26 is actuated once again, thereby causing the signature to be stored in the previously displayed PROM address.

If the store switch is not found to be set at 752, the program proceeds to 756, where the condition of the latch unstable switch 24 is determined. If the latch unstable switch has been found to be set, a latch unstable subroutine is performed at 758. In the latch unstable subroutine, the signatures on transition counts on a node during successive gate periods are examined to determine if there is any change in such signatures or transition counts. If so, the first unstable signature or transition count is displayed.

If an unstable data condition is not detected at 756, the program detects for data being ready at 760. If data is not ready, the program loops back to 752 until data is ready. As soon as data has been found to be ready at 760, the program determines at 761 whether the signature or transition count is stable. If unstable, the signature or transition count unstable indicator is illuminated at 762 and the signature or transition count is reset at 763 before proceeding to 764. If the signature or transition count is found at 761 to be stable, the program branches directly to 764. If the data is not then found to be stable at 764, the program returns to 740. Otherwise, the program determines at 766 whether the manual or automatic mode is selected. If the manual mode has been selected, an audio signal is generated and the signature or transition count is output to the display before returning to 746.

If the program determines at 766 that the auto mode has been selected, the program progresses to 770 to determine if the signature is in the PROM. If so, it is assumed that the signature on the node under test is proper and the program progresses to 772, where it determines if that signature has previously been found. If so, the microprocessor 310 applies two sets of pulses to the audio indicator 600 at 774 to indicate that a single node has been tested twice. If the signature has not been previously found, the microprocessor applies a single series of pulses to the audio indicator 600 at 776. After a predetermined delay at 778, a bit is set in the internal random-access memory at 780 and the found light-emitting diode 176 is illuminated.

If the signature is not found in PROM at 770, the program determines at 782 whether the signature is invalid, thereby indicating an improperly functioning circuit. If the signature is not invalid and yet was still not found, the microprocessor applies one long series of pulses to the audio indicator 600 at 784 and illuminates the not-found light-emitting diode 178 at 786 to indicate an improperly functioning circuit. Regardless of whether the signature is valid or invalid, or whether the signature is found or not found, the signature is then output to the display at 788.

As explained above with reference to FIG. 5, oscillator 290 generates an NMI pulse every 0.1 second to update the probe display. Accordingly, each 0.1 second, the program enters an NMI routine at 790, causing the probe display to be updated at 792 before returning through 794 to the main program.

We claim:

1. A system for testing a digital circuit, comprising:
   signature generation means receiving a digital signal from a node of said circuit for generating a signature word from said digital signal by combining each of a selected plurality of bits of said digital signature with preselected other ones of the selected plurality of bits of said digital signal;
   control means for allowing said signature generation means to respond to said digital signal during a gate period which is synchronized to the operation of said digital circuit so that, at the conclusion of said gate period, said signature generation means provides a signature which characterizes said digital signal during said gate period;
   signature memory means for storing respective signatures from a plurality of nodes of said digital circuit indicative of the digital signals on the nodes of said digital circuit when it is operating correctly during said gate period; and
   signature comparator means comparing the signature from said signature generation means with the signatures stored in said memory means until either a positive comparison is found or no positive comparison has been found after all of the signatures stored in said memory means have been compared, said signature comparator means generating a signature found indication in response to said positive comparison in response to all of said signatures being compared without a positive comparison.

2. The system of claim 1, further including means for programming said memory means with signatures from a digital circuit known to be operating correctly, said means including a programmer receiving signatures from said signature generation means as the digital signals from each node are applied to said signature generation means during said gate period, said programmer means further applying coded data signals and respective addresses to said memory means corresponding to said signatures.

3. The system of claim 2, further including verifying means for causing said comparator means to compare the output of said signature generation means with the signatures in said memory means before the signature from said signature generation means is written into said memory means and, in the event that the signature from said signature generation means is already stored in said memory means, for preventing the operation of said programming means and generating an indication so that duplicate signatures from the same node are not recorded in said memory means.

4. The system of claim 3, further including means for counting the number of signatures stored in said memory means and providing a visual indication thereof in order to facilitate verification that signatures from all nodes of said circuit have been stored in said memory means.

5. The system of claim 1 wherein said control means generate said gate period in response to a START signal from said digital circuit and terminate said gate period in response to a STOP signal from said digital circuit, said control means further including means for preventing said signature generation means from responding to said digital signal during said gate period responsive to a DISABLE signal from said digital circuit.

6. The system of claim 1, further including means for displaying an unstable signature comprising storage means connected to the output of said signature generation means for recording a signature, second comparator means for comparing subsequent signatures from said signature generation means with the signature recorded in said storage means, and means for continuously displaying any signature from said signature generation means which is not identical to the signature recorded in said storage means.

7. The system of claim 6 wherein said storage means records the signature from said signature generation means each time a new signature is generated and after said comparison is made by said second comparator means so that successive signatures are compared to each other.

8. The system of claim 1, further including automatic reset means for allowing repetitive signature comparisons from a plurality of different nodes while automatically resetting said system after each comparison, comprising:
latch means actuated by said comparison means for recording the signature from said signature generation means responsive to a match between said signature and one of the signatures stored in said memory means;
display means for visually displaying the signature recorded in said latch means; and
signal detection means for determining when said signature generation means is receiving a digital signal from a node of said circuit and for applying an ENABLE signal to said control means to allow said signature generation means to generate a new signature and for applying a reset signal to said latch means to allow said latch means to record the next signature from said signature generation means that matches a signature stored in said memory means.

9. The system of claim 1, further comprising:
transition counter means for counting the number of transitions of said digital signal occurring during said gate period;
transition count memory means for storing respective transition counts from a plurality of nodes of said digital circuit indicative of digital signals on the nodes of said digital circuit when it is operating correctly during said gate period;
transition count comparator means receiving transition counts from said transition counter means and from said transition count memory means for generating a positive comparison indication responsive to a match between the transition count from said transition counter means and any one of the transition counts stored in said transition count memory means, said transition count comparator means generating an indication responsive to a match between both transition counts and signatures during said gate period.

10. The system of claim 1, further including indicator means connected to said comparator means for providing an indication in the event that the signature from said signature generation means matches none of the signatures stored in said signature memory means.

11. An apparatus for testing a digital electronic circuit, comprising:
input means for receiving an digital signal from a selected location in said digital electronic circuit;
clock means for delivering a series of clock pulses, each pulse being coincident with a bit of said digital signal;
signature generation means connected to said input means and said clock means for generating a signature word from said digital signal by combining of a selected plurality of bits in said digital signal with preselected other ones of said selected plurality of bits of said digital signal;
trigger means connected to said digital electronic circuit and connected to said signature generation means for initiating the generation of a signature word in response to a predetermined trigger signal from digital electronic circuit at the start of a gate period;
stop means connected to said signature generation means for terminating the generation of a signature word at the end of said gate period;
memory means for recording a set of signature words corresponding to the digital signals at a set of selected locations of said digital electronic circuit when said digital electronic circuit is operating correctly during said gate period; and
comparator means for comparing the signature word generated by said signature generation means with the signature words recorded in said memory means and for providing an indication of the results of said comparisons.

12. The apparatus of claim 11, further including indicator means connected to said comparator means for providing an indication in the event that the signature from said signature generation means matches none of the signatures stored in said memory means.

13. The apparatus of claim 11, further including means for programming said memory means with signature words from a set of selected locations of a digital circuit known to be operating correctly, said means receiving signature words from said signature generation means as the digital signals from each selected location are applied to said signature generation means and for writing said signature words into respective locations in said memory means in response thereto.

14. The system of claim 13, further including verifying means for causing said comparator means to compare the signature words from said signature generation means with the signature words in said memory means before the signature words from said signature generation means are written into said memory means and, in the event that said signature word from said signature generation means is already stored in said memory means, for preventing the operation of said programming means and generating an indication so that duplicate signature words from the same selected location are not recorded in said memory means.

15. The apparatus of claim 14, further including means for counting the number of signatures stored in said memory means and providing a visual indication thereof in order to facilitate verification that signatures from all nodes of said circuit have been stored in said memory.

16. A method of testing a digital circuit, comprising:
recording a set of signatures which correspond to the signatures on a set of nodes of said circuit when it is operating correctly during a predetermined gate period that is synchronized to the operation of said circuit;
generating a signature from a data stream present on a test node of said circuit taken from said set of nodes during said gate period; and
comparing the signature on said test node to each recorded signature without regard to the identity of said test node until a match is found, thereby indicating the correct operation of said circuit.

17. The method of claim 16, further including the steps of:
recording a set of transition counts which correspond to the number of transitions of respective digital signals on a set of nodes of said circuit when it is operating correctly during said predetermined gate period;
counting the number of transitions on said test node during said gate period; and
comparing the count of transitions on said test node to each recorded transition count without regard to the identity of said test node until a match is found and then determining whether the node corresponding to the recorded transition count which matches the transition count on said test node is identical to the node corresponding to the recorded signature which matches the signature on said test node.

* * * * *